United States Patent
Chang et al.

(10) Patent No.: US 8,171,188 B2
(45) Date of Patent: May 1, 2012

(54) METHOD OF HANDLING SUCCESSIVE BITSTREAM EXTRACTION AND PACKING AND RELATED DEVICE

(75) Inventors: Chuan-Hua Chang, Taipei (TW); Hong-Men Su, Hsinchu County (TW)

(73) Assignee: Andes Technology Corporation, Science-Based Industrial Park, Hsin-Chu (TW)

( * ) Notice: Subject to any disclaimer, the term of this patent is extended or adjusted under 35 U.S.C. 154(b) by 681 days.

(21) Appl. No.: 12/271,924

(22) Filed: Nov. 16, 2008

(65) Prior Publication Data

US 2010/0124308 A1    May 20, 2010

(51) Int. Cl.
*G06F 5/14*     (2006.01)
*G06F 7/24*     (2006.01)

(52) U.S. Cl. .......... 710/52; 712/300

(58) Field of Classification Search .......... None
See application file for complete search history.

(56) References Cited

U.S. PATENT DOCUMENTS

| | | | |
|---|---|---|---|
| 5,521,918 A * | 5/1996 | Kim | 370/428 |
| 6,339,386 B1 * | 1/2002 | Cho | 341/67 |
| 6,844,834 B2 * | 1/2005 | Maruya et al. | 341/60 |
| 7,315,937 B2 * | 1/2008 | Jones et al. | 712/300 |
| 2002/0053015 A1 * | 5/2002 | Tan et al. | 712/42 |
| 2003/0120904 A1 * | 6/2003 | Sudharsanan et al. | 712/223 |

* cited by examiner

*Primary Examiner* — Eron J Sorrell
*Assistant Examiner* — Dayton Lewis-Taylor
(74) *Attorney, Agent, or Firm* — Winston Hsu; Scott Margo

(57) ABSTRACT

To handle boundary conditions efficiently during bitstream extraction, a predetermined number of bits are extracted from the bitstream register starting from a most significant bit of the bitstream register when an underflow flag is set. The predetermined number equals a predetermined extraction width minus a previous starting position. The bits are stored in a lowest part of a destination register, and the underflow flag is cleared.

1 Claim, 18 Drawing Sheets

```
SUB   SA1,32,SP
SLL   DR,BSR,SA1
SRL   DR,DR,SA1
MOV   SP,32
LW    BSR,[BSM]
ADD   BSM,BSM,4
```

Bitstream extraction instruction sequence for the case of SP == LE

```
SUB   C,A,B: subtraction, C=A-B
SLL   C,A,B: shift left logical, C=A<<B
SRL   C,A,B: shift right logical, C=A>>B
MOV   C,A  : move A to C
LW    C,[A]: load memory A to C
ADD   C,A,B: addition, C=A+B
```

BSM contains bitstream memory address

FIG. 14  PRIOR ART

```
SUB   SA1,32,SP
SLL   DR,BSR,SA1
SUB   SA2,32,LE
SRL   DR,DR,SA2
SUB   LE,LE,SP
SUB   SP,32,LE
LW    BSR,[BSM]
ADD   BSM,BSM,4
SUB   SA3,32,LE
SRL   TR,BSR,SA3
OR    DR,DR,TR
```

Bitstream extraction instruction sequence for the case of SP< LE

```
SUB   C,A,B: subtraction, C=A-B
SLL   C,A,B: shift left logical, C=A<<B
SRL   C,A,B: shift right logical, C=A>>B
MOV   C,A   : move A to C
LW    C,[A] : load memory A to C
ADD   C,A,B: addition C=A+B
OR    C,A,B: or, C = A | B
```

BSM contains bitstream memory address

FIG. 15  PRIOR ART

```
SUB    SA1,LP,SP
SRL    TR,SR,SA1
OR     BSR,BSR,TR
SW     BSR,[BSM]
ADD    BSM,BSM,4
ADD    SA2,32,SP
SUB    SA2,SA2,LP
SLL    BSR,SR,SA2
MOV    SP,SA2
```

Bitstream packing instruction sequence for the case of SP < LP

```
SUB    C,A,B : subtraction, C=A-B
SLL    C,A,B : shift left logical, C=A<<B
SRL    C,A,B : shift right logical, C=A>>B
MOV    C,A   : move A to C
SW     C,[A] : store C to memory A
ADD    C,A,B : addition, C=A+B
OR     C,A,B : or, C = A | B
```

BSM contains bitstream memory address

FIG. 18  PRIOR ART

METHOD OF HANDLING SUCCESSIVE BITSTREAM EXTRACTION AND PACKING AND RELATED DEVICE

BACKGROUND OF THE INVENTION

1. Field of the Invention

The present invention relates to methods of handling bitstreams, and more particularly, to methods for efficiently handling extraction and packing of bitstreams.

2. Description of the Prior Art

Bitstreams are used for many different types of applications, including multimedia file streaming, as well as network streaming. Typically, bitstream operations may be divided into extraction and packing operations. For example, bitstream extraction may be used when playing a streaming audio file, whereas bitstream packing may be used when encoding the streaming audio file.

Extracting bits from a bitstream in memory in succession requires a number of operations/instructions based on extraction conditions. The bits to be extracted reside in a bitstream storage register (BSR), and are extracted to a destination register (DR). Once all of the bits in the BSR are extracted, i.e. the BSR is empty, a fixed number of new bits, e.g. 32 bits, are loaded into the BSR from the memory. A starting position (SP), stored in a position register, specifies where to begin extraction. A length of extraction (LE), stored in a length register, specifies how many bits to extract from the BSR. For example, SP may be in a range of 1-32, and LE may be in a range of 1-32. Three cases arise depending on values of SP and LE: SP>LE, SP==LE, and SP<LE.

For the first case, SP>LE, the bits to be extracted are completely contained in the BSR, and there are more bits in the BSR remaining after extraction. In this case, the BSR is shifted left 32-SP bits, and the intermediate result is temporarily written to the DR. Then, the intermediate result in the DR is shifted right 32-LE bits, and the final extracted result is written to the DR. Finally, the position register is updated to SP-LE. An example instruction sequence 1300 illustrating these operations is shown in FIG. 13.

For the second case, SP==LE, the bits to be extracted are completely contained in the BSR, and no bits remain in the BSR after extraction. In this case, the BSR is shifted left 32-SP bits, and the intermediate result is temporarily written to the DR. The intermediate result in the DR is then shifted right 32-SP bits, and the final extracted result is written to the DR. Also, the position register is updated to 32, and because the BSR data is completely extracted, 32 new bits are loaded to the BSR from memory. An example instruction sequence 1400 illustrating these operations is shown in FIG. 14.

Finally, for the third case, SP<LE, the bits to be extracted are not completely in the BSR. This boundary condition in which the BSR does not contain as many bits as are to be extracted is called "underflow." The BSR is shifted left 32-SP bits, and the intermediate result is temporarily written to the DR. Then, the intermediate result in DR is shifted 32-LE bits, and the new intermediate result is written to the DR. The position register is updated to 32, and the length register is updated to LE-SP. The BSR data is completely extracted, so 32 new bits are loaded to the BSR from memory. After that, the remaining bits are extracted into a temporary register TR, and the DR and the TR are OR'ed, with the final extracted result thereof written to the DR. An example instruction sequence 1500 illustrating these operations is shown in FIG. 15.

Packing bits into a bitstream in memory in succession requires a number of operations/instructions based on packing conditions. The packed data from a source register (SR) is recorded in a bitstream storage register (BSR). Once the BSR is full, the content of the BSR is stored to the memory. A starting position (SP) is stored in a position register, and a length of packing (LP) is stored in a length register. For example, SP may be in a range of 1-32, and LP may be in a range of 1-32. Three cases arise depending on values of SP and LP: SP>LP, SP==LP, and SP<LP.

For the first case, SP>LP, the BSR can contain all of the bits to be packed, and the BSR will have bits left over for future packing. The packing operation sequence is as follows. The SR is shifted left SP-LP bits, and the intermediate result thereof is temporarily written to the SR. Then, the BSR and the SR are OR'ed, and the final packed result thereof is written to the BSR. Further, the position register is updated to SP-LP. An example instruction sequence 1600 illustrating these operations is shown in FIG. 16.

For the second case, SP==LP, the BSR can contain all of the bits to be packed, but the BSR will have no bits left over for future packing. The packing operation sequence is as follows. The BSR and the SR are OR'ed, and the final packed result thereof is written to the BSR. Further, the position register is updated to 32. The BSR is stored to memory, and the BSR is updated to 0 to prepare for future packing. An example instruction sequence illustrating these operations 1700 is shown in FIG. 17.

Finally, for the third case, SP<LP, the BSR cannot contain all of the bits to be packed. The bits to be packed need to be separated into two parts for packing. This boundary condition in which the BSR cannot contain as many bits as are to be packed is called "overflow." The two-part packing operation sequence is as follows. The SR is shifted right LP-SP bits, and the intermediate result is written to a temporary register (TR). The BSR is OR'ed with the TR, and the result thereof is written to the BSR. The BSR is stored to memory. Then, the SR is shifted right 32-LP+SP bits, and the result thereof is written to the BSR. Further, the position register is updated to 32-LP+SP. An example instruction sequence 1800 illustrating these operations is shown in FIG. 18.

As shown in FIG. 8, a MIPS DSP Application Specific Extension has instructions for extracting 1-32 bits from a 64-bit register, but the instructions do not handle extraction cases where the extracted bits cross the 64-bit boundary. Also, U.S. Pat. No. 7,334,116 B2 (hereafter '116) uses a 64-bit buffer and individual left/right shifting operations to extract a certain number of bits from a bitstream in memory. However, '116 does not handle boundary conditions efficiently, and also requires that the bitstream buffer have a bit length greater than an address boundary length of the memory. Thus, boundary conditions for bitstream extraction and packing are not handled efficiently, reducing overall system efficiency.

SUMMARY OF THE INVENTION

According to a first embodiment of the present invention, a method of extracting bits from a bitstream register starts with extracting a predetermined number of bits from the bitstream register starting from a predetermined starting position when the predetermined starting position is greater than a predetermined extraction width. The predetermined number equals the predetermined extraction width. Then, the bits are stored in a lowest part of a destination register, an upper part of the destination register not storing the bits is set to a predetermined value when no underflow occurs, and the predetermined starting position is updated by subtracting the predetermined number from the predetermined starting position. In addition, an empty flag and an underflow flag are cleared.

According to the first embodiment of the present invention, a method of extracting bits from a bitstream register starts with extracting a predetermined number of bits from the bitstream register starting from a predetermined starting position when the predetermined starting position equals a predetermined extraction width. The predetermined number equals the predetermined extraction width. Then, the bits are stored in a lowest part of a destination register. An upper part of the destination register not storing the bits is set to a predetermined value when no underflow occurs. An empty flag is set to indicate shortage of bitstream data in the bitstream register, an underflow flag is cleared, and the predetermined starting position is updated to a predetermined bit of the bitstream register to prepare for next extraction.

According to the first embodiment of the present invention, a method of extracting bits from a bitstream register starts with extracting a predetermined number of bits from the bitstream register starting from a predetermined starting position when the predetermined starting position is less than a predetermined extraction width. The predetermined number equals the predetermined starting position. Then, a plurality of buffer bits of a predetermined value are appended to the bits extracted from the bitstream register to increase number of the bits to the predetermined extraction width. The bits are stored in a lowest part of a destination register starting from a position equaling the predetermined extraction width. Finally, an upper part of the destination register not storing the bits is set to the predetermined value when an underflow flag is not set, the predetermined starting position is updated to a predetermined bit of the bitstream register to prepare for next extraction, the predetermined extraction width is updated to the predetermined extraction width minus the predetermined starting position, an empty flag and the underflow flag is set.

According to the first embodiment of the present invention, a method of extracting bits from a bitstream register starts with extracting a predetermined number of bits from the bitstream register starting from a most significant bit of the bitstream register when an underflow flag is set. The predetermined number equals a predetermined extraction width that can be a previous extraction width minus a previous starting position. The bits are stored in a lowest part of a destination register, an empty flag is cleared, and the underflow flag is unset.

According to the first embodiment of the present invention, a method of extracting bits from a bitstream register comprises extracting a predetermined number of bits from the bitstream register starting from a predetermined starting position when the predetermined starting position is greater than a predetermined extraction width, the predetermined number equaling the predetermined extraction width, storing the bits in a lowest part of a destination register, setting an upper part of the destination register not storing the bits to a predetermined value when no underflow occurs, and updating the predetermined starting position by subtracting the predetermined number from the predetermined starting position. In addition, an empty flag and an underflow flag are cleared. The method further comprises extracting the predetermined number of bits from the bitstream register starting from the predetermined starting position when the predetermined starting position equals the predetermined extraction width, the predetermined number equaling the predetermined extraction width, storing the bits in the lowest part of the destination register, setting the upper part of the destination register not storing the bits to the predetermined value when no underflow occurs, setting an empty flag to indicate shortage of bitstream data in the bitstream register, an underflow flag is cleared, and updating the predetermined starting position to a predetermined bit of the bitstream register to prepare for next extraction. The method further comprises extracting the predetermined number of bits from the bitstream register starting from the predetermined starting position when the predetermined starting position is less than the predetermined extraction width, the predetermined number equaling the predetermined starting position, appending a plurality of buffer bits of the predetermined value to the bits extracted from the bitstream register to increase number of the bits to the predetermined extraction width, storing the bits in the lowest part of the destination register starting from a position equaling the predetermined extraction width, setting the upper part of the destination register not storing the bits to the predetermined value when an underflow flag is not set, updating the predetermined starting position to the predetermined bit of the bitstream register to prepare for next extraction, updating the predetermined extraction width to the predetermined extraction width minus the predetermined starting position, and setting an empty flag and the underflow flag. The method further comprises extracting the predetermined number of bits from the bitstream register starting from a most significant bit of the bitstream register when the underflow flag is set, the predetermined number equaling the predetermined extraction width that can be a previous extraction width minus a previous starting position, storing the bits in the lowest part of the destination register, and unsetting an empty flag and the underflow flag.

According to a second embodiment of the present invention, a method of packing bits to a bitstream register starts with packing a predetermined number of bits from a source register when a predetermined starting position is greater than a predetermined packing width. The predetermined number equals the predetermined packing width. The bits are stored in the bitstream register starting from the predetermined starting position of the bitstream register. A full flag and an overflow flag are cleared, and the predetermined starting position is updated to the predetermined starting position minus the predetermined packing width.

According to the second embodiment of the present invention, a method of packing bits to a bitstream register starts with packing a predetermined number of bits from a lowest part of a source register when a predetermined starting position is equal to a predetermined packing width. The predetermined number equals the predetermined packing width. The bits are stored in the bitstream register starting from the predetermined starting position of the bitstream register. A full flag is set, and an overflow flag is cleared, and the predetermined starting position is updated to a predetermined bit of the bitstream register.

According to the second embodiment of the present invention, a method of packing bits to a bitstream register starts with packing a predetermined number of bits from a lowest part of a source register when a predetermined starting position is less than a predetermined packing width. The predetermined number equals the predetermined starting position. The bits are stored in the bitstream register starting from the predetermined starting position of the bitstream register. A full flag and an overflow flag are set, the predetermined starting position is updated to a predetermined bit of the bitstream register, and the predetermined packing width is updated to the predetermined packing width minus the predetermined starting position.

According to the second embodiment of the present invention, a method of packing bits to a bitstream register comprises packing a predetermined number of bits from a source register when a predetermined starting position is greater than a predetermined packing width, the predetermined number equaling the predetermined packing width, storing the bits in the bitstream register starting from the predetermined starting position of the bitstream register, clearing a full flag and an overflow flag, and updating the predetermined starting position to the predetermined starting position minus the predetermined packing width. The method further comprises packing the predetermined number of bits from a lowest part of the source register when the predetermined starting position is equal to the predetermined packing width, the predetermined number equaling the predetermined packing width, storing the bits in the bitstream register starting from the predetermined starting position of the bitstream register, setting the full flag and clearing the overflow flag, and updating the predetermined starting position to a predetermined bit of the bitstream register. The method further comprises packing the predetermined number of bits from the lowest part of the source register when the predetermined starting position is less than the predetermined packing width, the predetermined number equaling the predetermined starting position, storing the bits in the bitstream register starting from the predetermined starting position of the bitstream register, setting the full flag and the overflow flag, updating the predetermined starting position to the predetermined bit of the bitstream register, and updating the predetermined packing width to the predetermined packing width minus the predetermined starting position.

According to the first embodiment, a bitstream extraction apparatus comprises a bitstream register storing data for extraction, a shifter for shifting the data extracted from the bitstream register according to a difference result, a destination register for storing the data shifted by the shifter, a starting point register for storing a starting point, an extraction width register for storing an extraction width, an arithmetic logic unit for comparing the starting point and the extraction width to generate a comparison result, and for generating the difference result according to the starting point and the extraction width, and control logic for updating the extraction width, updating the starting point, and controlling left/right shift direction of the shifter according to the comparison result.

According to the second embodiment, a bitstream packing apparatus comprises a source register storing data for packing, a shifter for shifting the data extracted from the source register according to a difference result, a destination register for storing the data shifted by the shifter, a starting point register for storing a starting point, a packing width register for storing a packing width, an arithmetic logic unit for comparing the starting point and the packing width to generate a comparison result, and for generating the difference result according to the starting point and the packing width, and control logic for updating the packing width, updating the starting point, and controlling left/right shift direction of the shifter according to the comparison result.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 13-15 are example instruction sequences for extracting bits from a bitstream register according to the prior art.

FIGS. 16-18 are example instruction sequences for packing bits to a bitstream register according to the prior art.

DETAILED DESCRIPTION

Please refer to FIGS. 1-4 in conjunction with FIG. 9 and FIGS. 13-15, which are diagrams illustrating a method of extracting bits from a bitstream register (BSR) Ra according to a first embodiment of the present invention. As shown in FIGS. 1-4, the BSR Ra may comprise 32 bits, from 0-31. The bits of the BSR Ra may be extracted and stored in a destination register (DR) Rt. A configuration register Rb may store a predetermined extraction width (LE) in Rb(4,0), a predetermined starting position (SP) in Rb(9,5), an empty flag in Rb(13), and an underflow flag in Rb(31). Of course, the LE, the SP, the empty flag, and the underflow flag may be assigned to other parts of the configuration register Rb, or may even reside in different registers. The method of extracting bits from the BSR Ra according to the first embodiment of the present invention is illustrated by way of a flowchart in FIG. 9.

Figure 1:
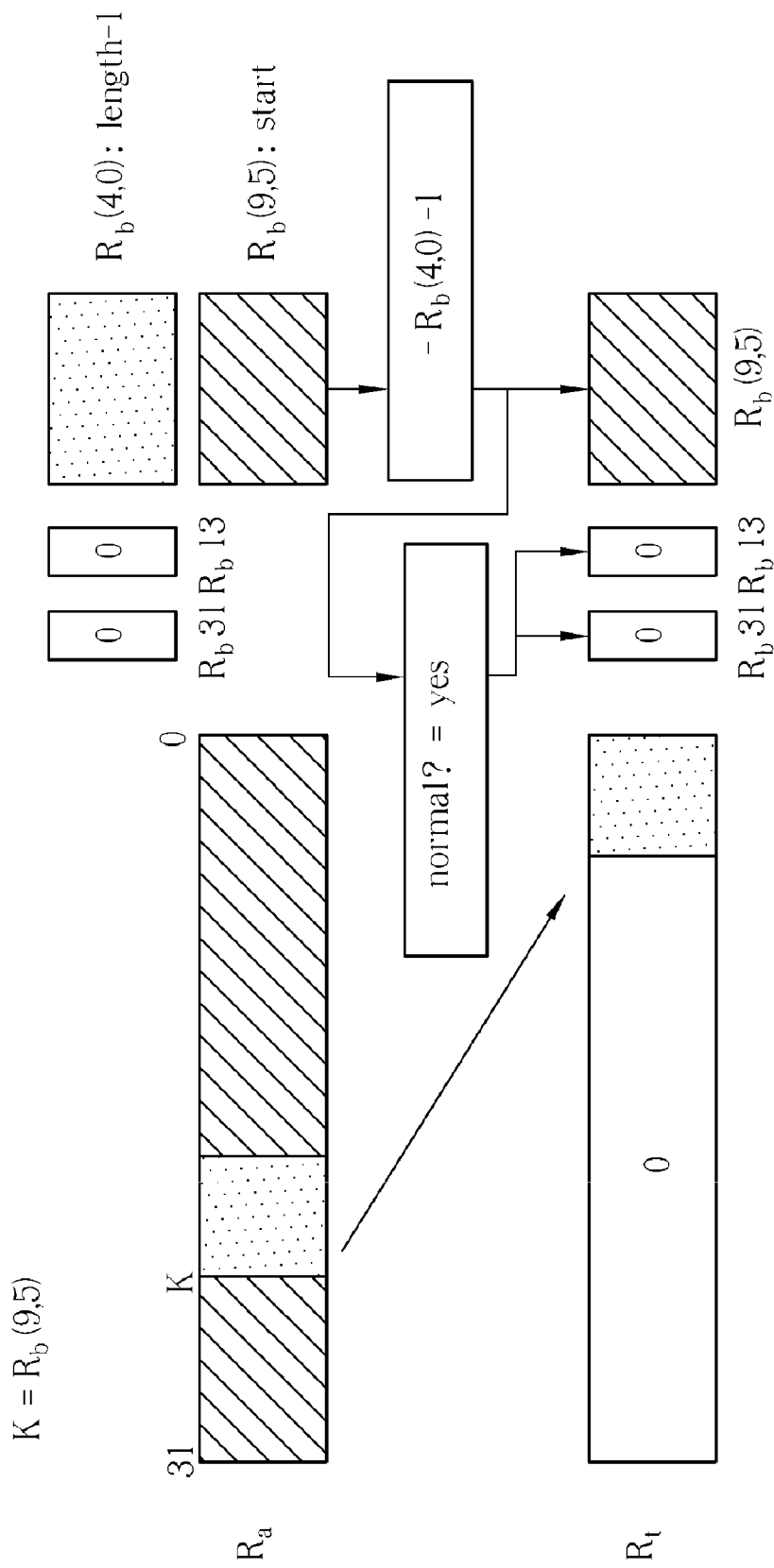
FIG. 1 is a diagram of extracting bits from a bitstream register according to a first embodiment of the present invention.
Figure 9:
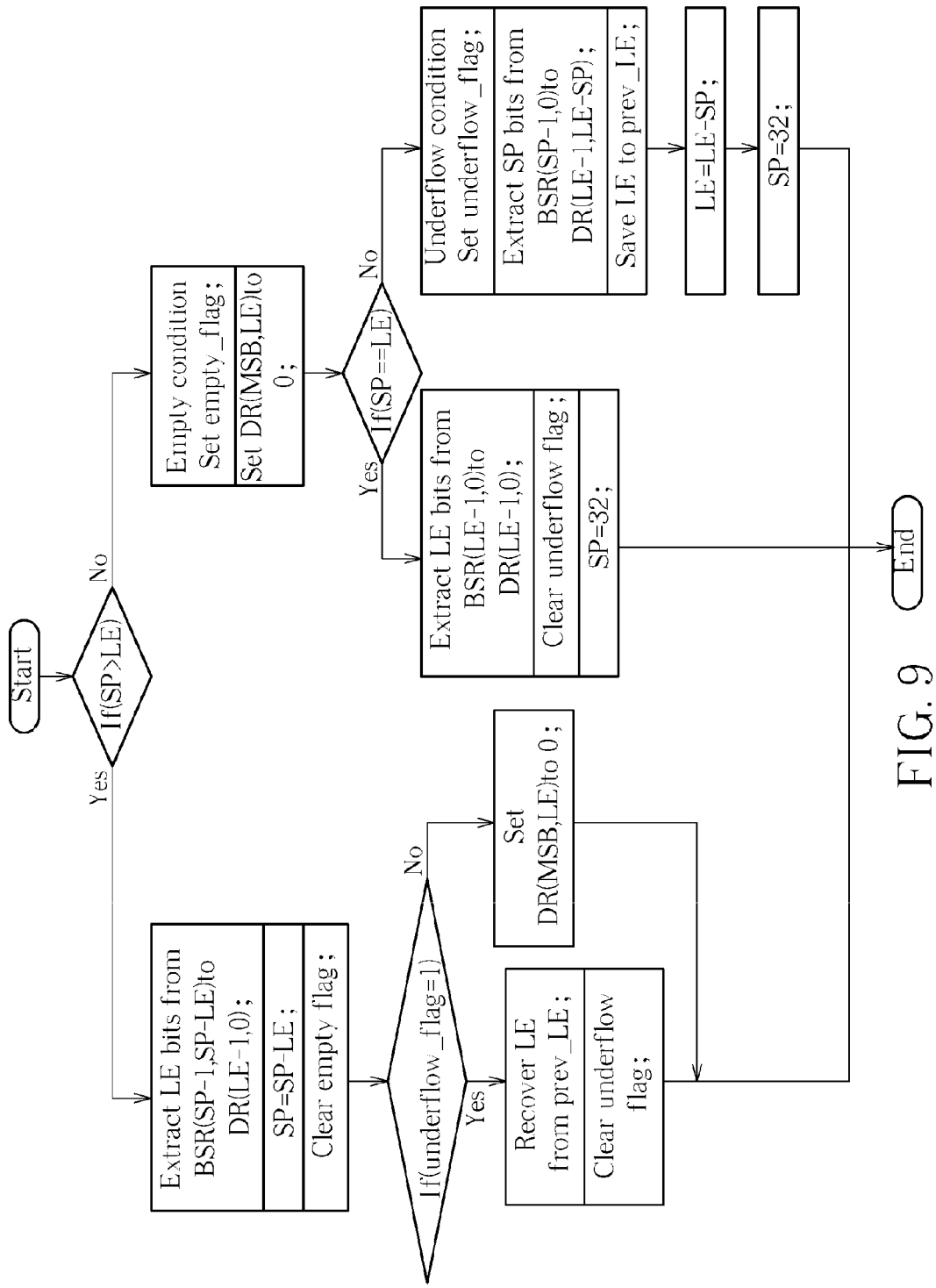
FIG. 9 is a flowchart of a method of extracting bits according to the first embodiment.

From FIG. 9, if SP>LE, LE bits are extracted from the BSR Ra to the DR Rt. This is shown in FIG. 1, which illustrates extracting bits from the BSR Ra when SP>LE. LE bits, e.g. BSR(SP-1,SP-LE) are extracted from the BSR Ra, and stored in the lowest part of the DR Rt, e.g. DR(LE-1,0). Since SP is greater than LE, some bits remain in the BSR after extraction, so no underflow occurs, and the upper part of the DR, e.g. DR(31,LE), is filled with a predetermined value, such as 0. SP is then updated to SP-LE. If the empty flag was originally set, the empty flag is cleared. If the underflow flag was originally set, LE is recovered from a previous LE, and the underflow flag is cleared. Else, DR(MSB, LE) is set to 0.

Figure 2:
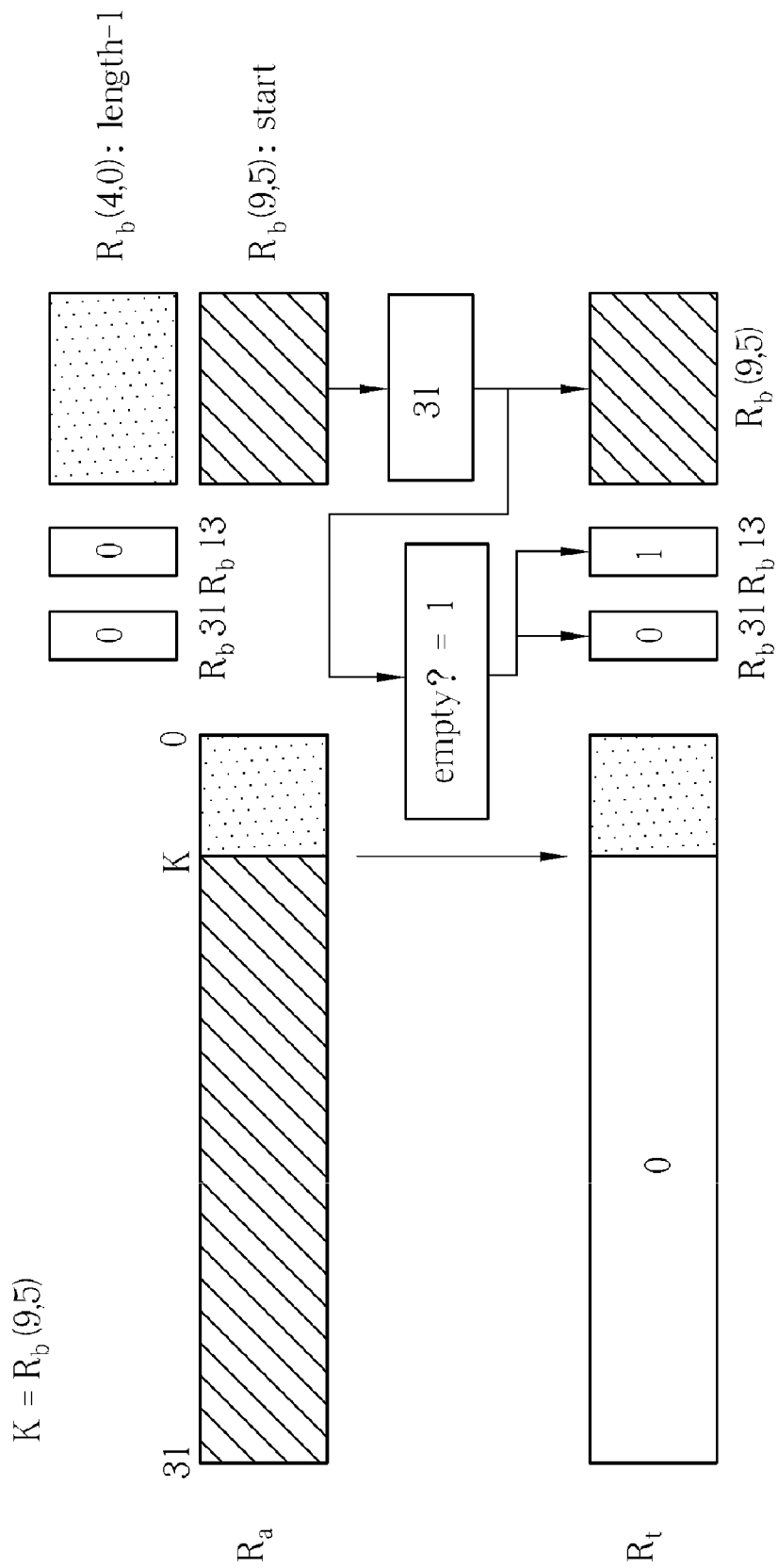
FIGS. 2-4 are diagrams of extracting bits from a bitstream register according to the first embodiment of the present invention.

Again from FIG. 9, if SP==LE, an empty condition exists, so the empty flag is set, and DR(MSB,LE) is set to 0. Then, LE bits, e.g. BSR(LE-1,0), are extracted from the BSR Ra to the DR Rt, e.g. DR(LE-1,0). This is shown in FIG. 2, which illustrates extracting bits from the BSR Ra when SP==LE. LE bits are extracted from the BSR Ra, and stored in the lowest part of the DR Rt, e.g. DR(LE-1,0). No underflow occurs, so the upper part of the DR, e.g. DR(31,LE), is filled with the predetermined value, e.g. 0, and the underflow flag is cleared. SP is then updated to a predetermined bit, such as the most significant bit or least significant bit, of the BSR, e.g. 32, to prepare for future extraction.

Figure 3:
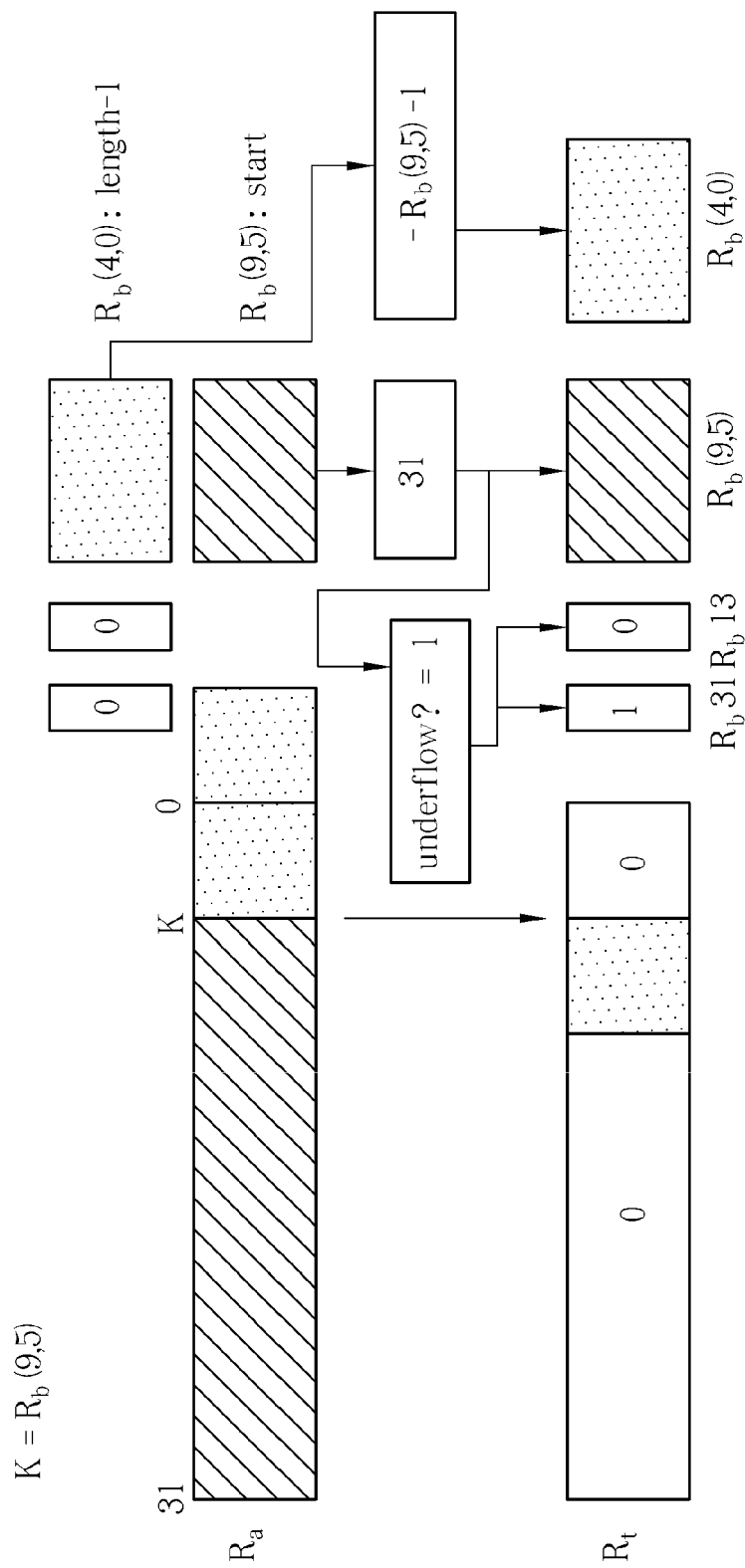

If SP<LE, again the empty flag is set due to the empty condition, and DR(MSB,LE) is set to 0. Then, SP bits, e.g. BSR(SP-1,0), are extracted from the BSR Ra to the lowest part of the DR Rt starting from the LE-1 position, e.g. DR(LE-1, LE-SP). This is shown in FIG. 3, which illustrates extracting bits from the BSR Ra when SP<LE. LE-SP buffer bits of the predetermined value are appended to increase number of the bits to LE. Because SP<LE, underflow occurs, so the underflow flag in Rb(31) is set, e.g. Rb(31)=1. The upper part of the DR is set to the predetermined value, e.g. DR(32,LE)=0. SP is updated to the predetermined bit, e.g. the MSB of the bitstream register, e.g. 32, to prepare for the next extraction, and LE is updated to LE-SP. Before LE is updated, the original LE value is also saved to a previous LE variable prev_LE.

Figure 4:
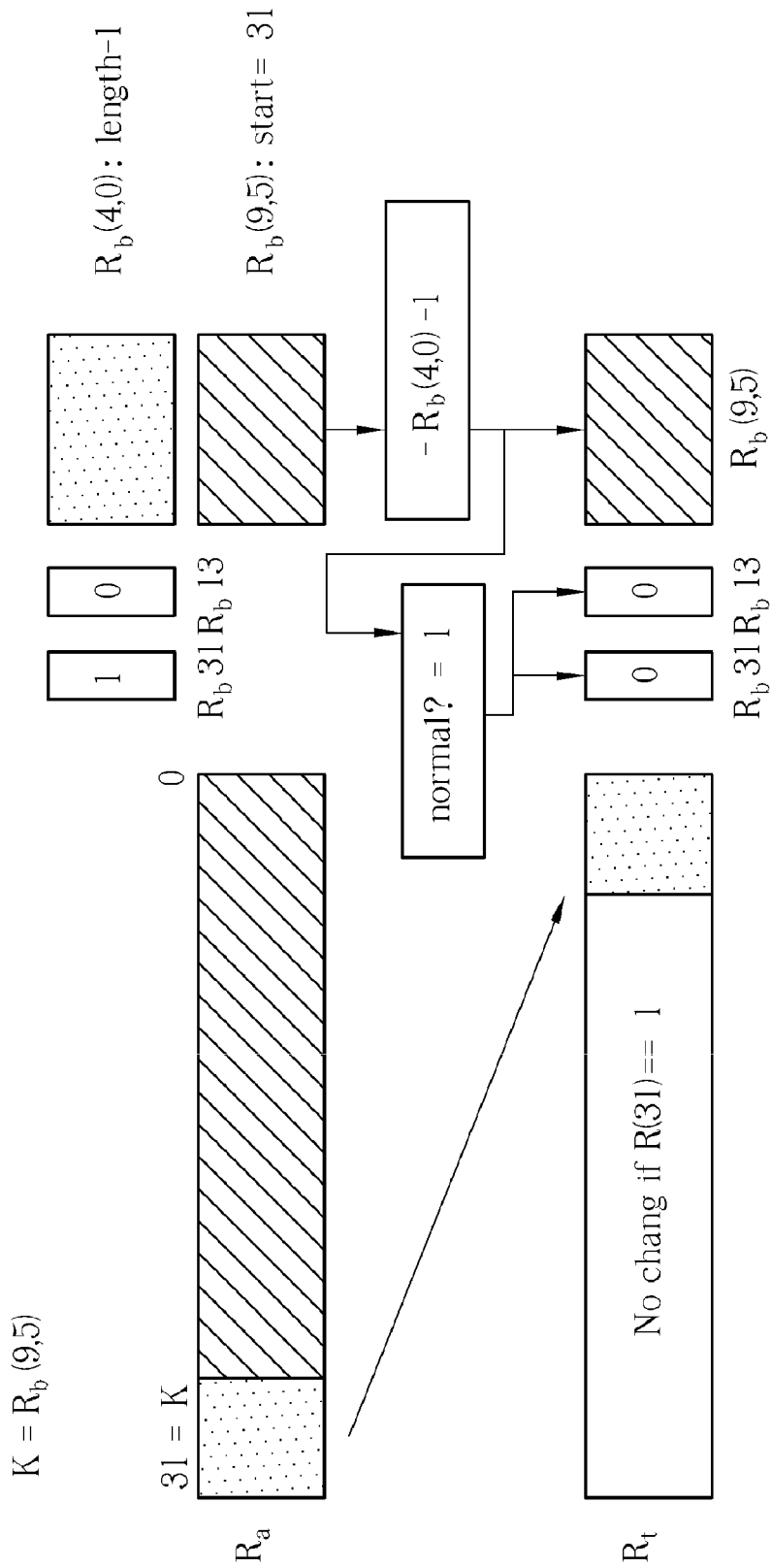

Please refer to FIG. 4, which illustrates extracting bits from the BSR Ra after the extraction operations illustrated in FIG. 3, i.e. when the underflow flag in Rb(31) is set. Thus, the number of bits extracted is equal to a value left from the previous extraction that is the LE of the previous extraction minus the SP of the previous extraction. In other words, these bits are the remaining un-extracted part of a full LE-bit extraction uncompleted from the previous extraction. The bits are placed in the lowest part of the DR, e.g. DR(LE-SP-1,0), which is where the buffer bits were appended in the previous operation. Then, since the underflow flag in Rb(31) is set, the upper part of the DR is left unchanged, so as to keep the SP bits extracted in the previous operation. Thus, all LE bits may be extracted efficiently when SP<LE by utilizing the underflow flag and the embodiments shown in FIGS. 3 and 4.

Figure 5:
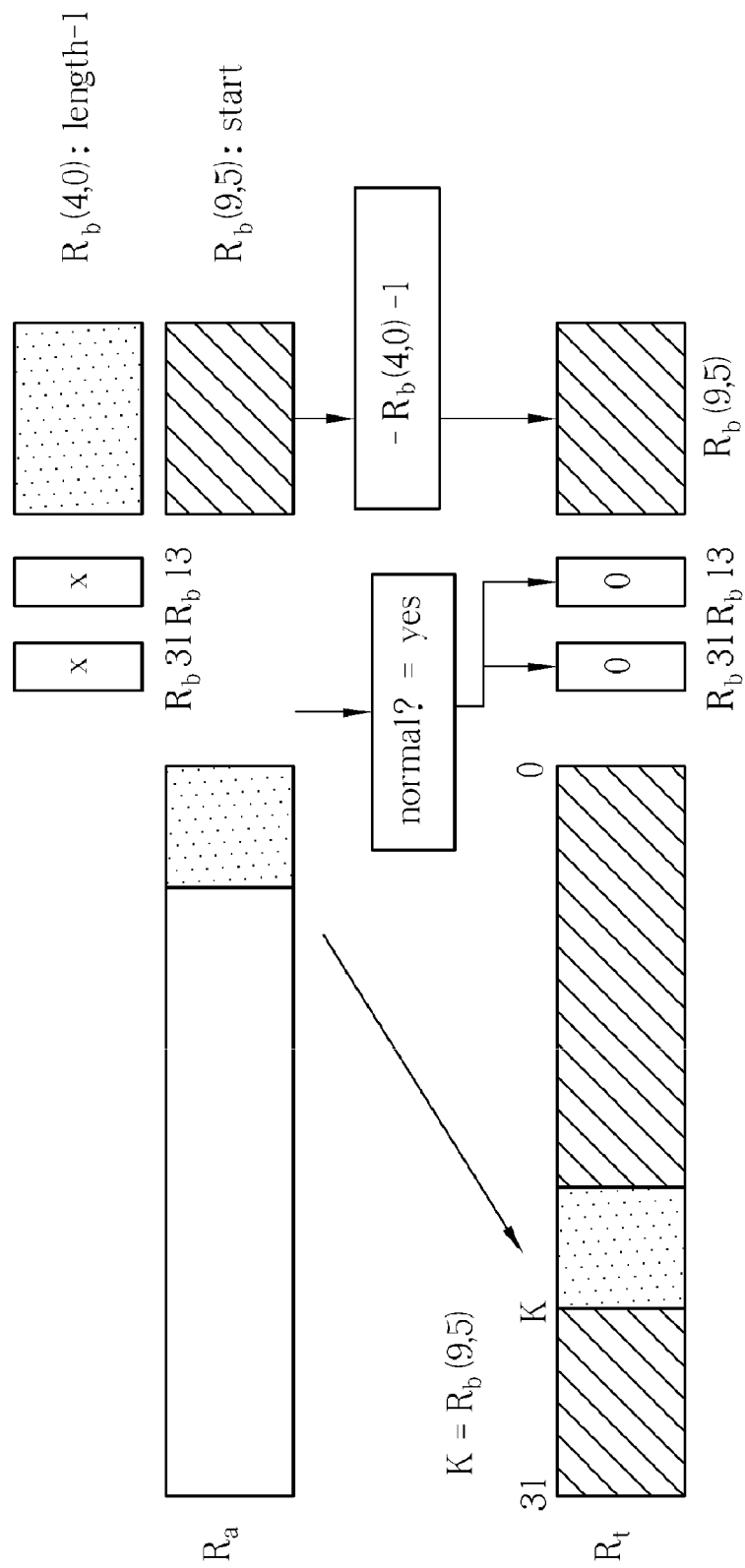
FIGS. 5-7 are diagrams of packing bits to a bitstream register according to a second embodiment of the present invention.
Figure 6:
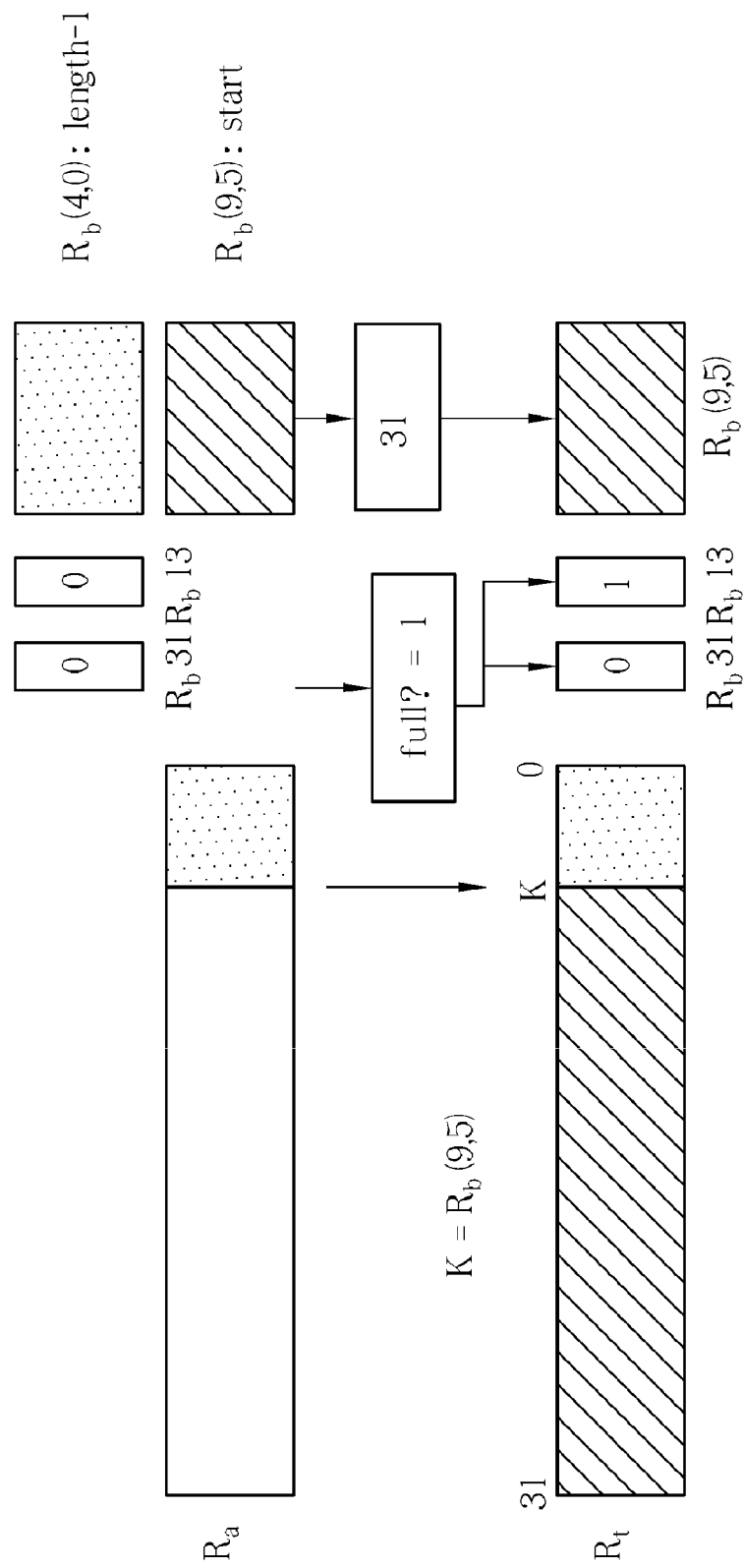
Figure 7:
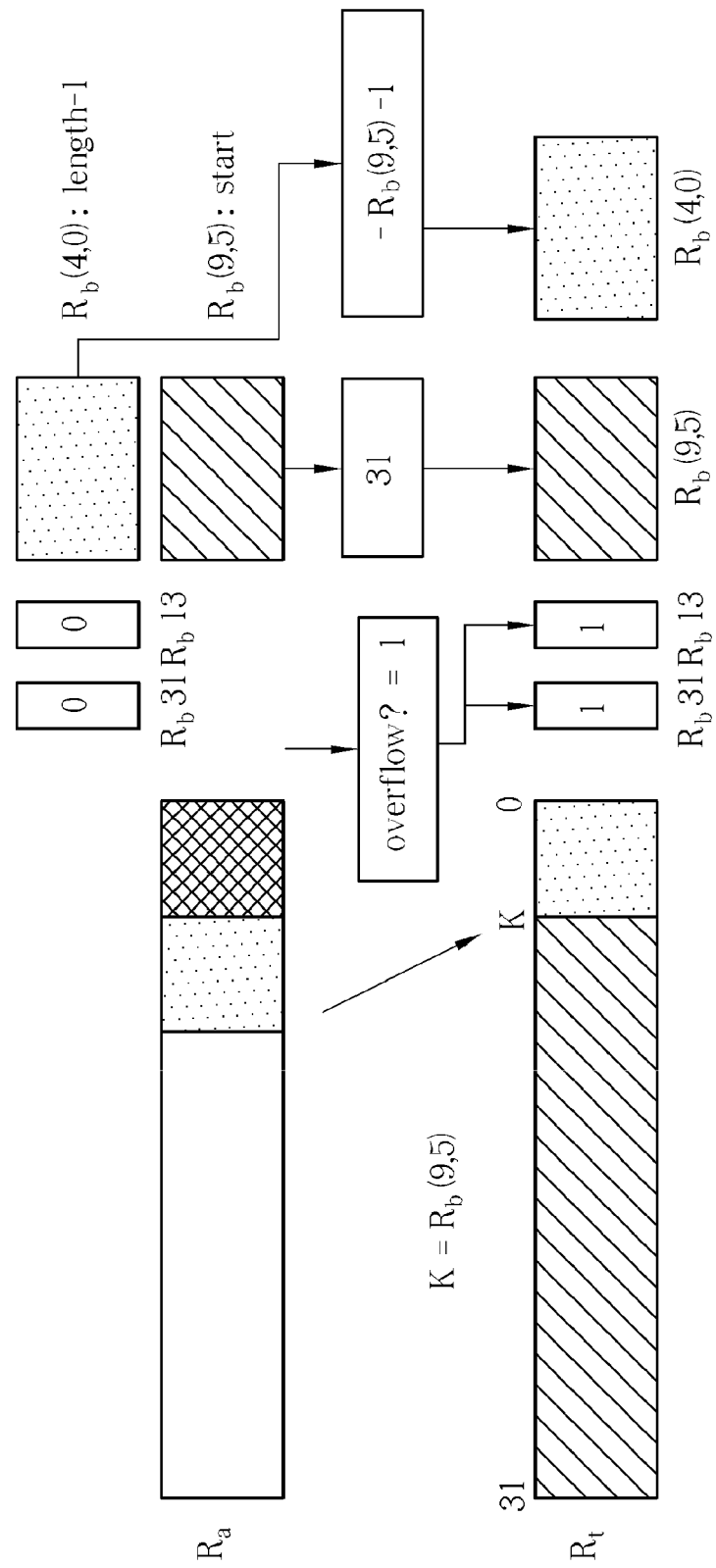
Figure 8:
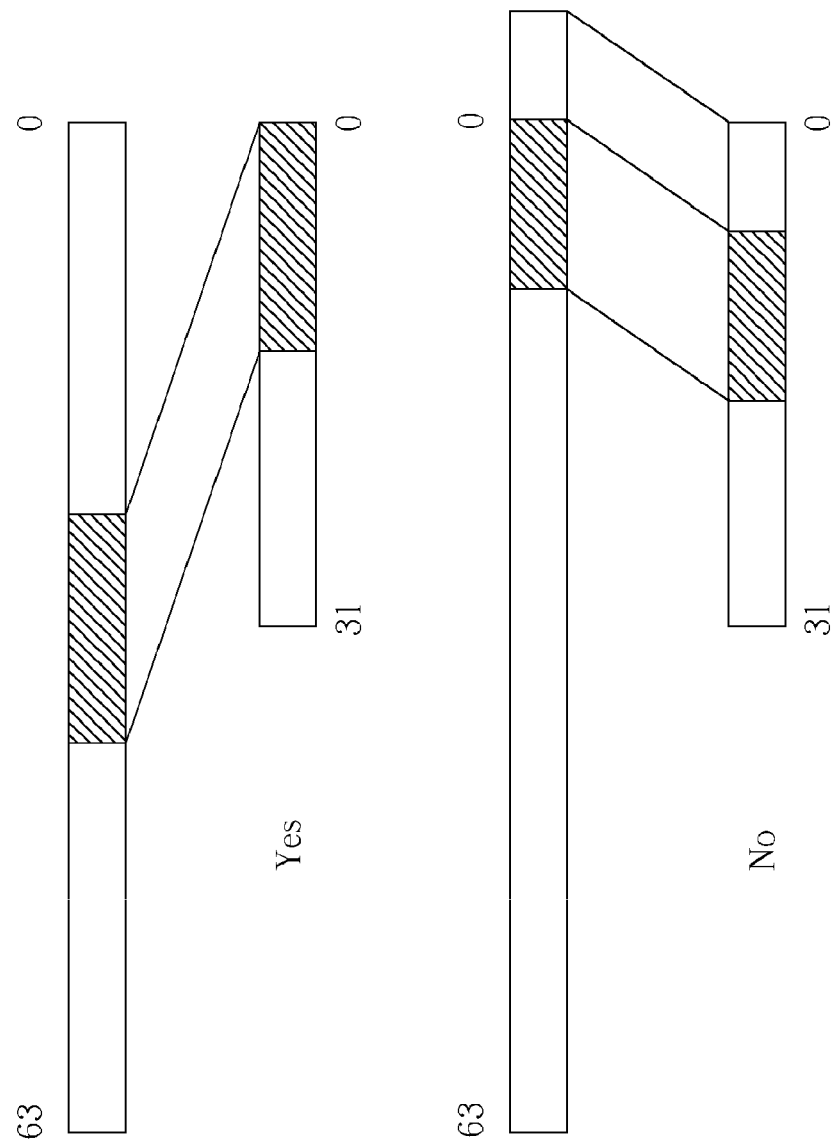
FIG. 8 is a diagram of bitstream extraction according to the prior art.
Figure 10:
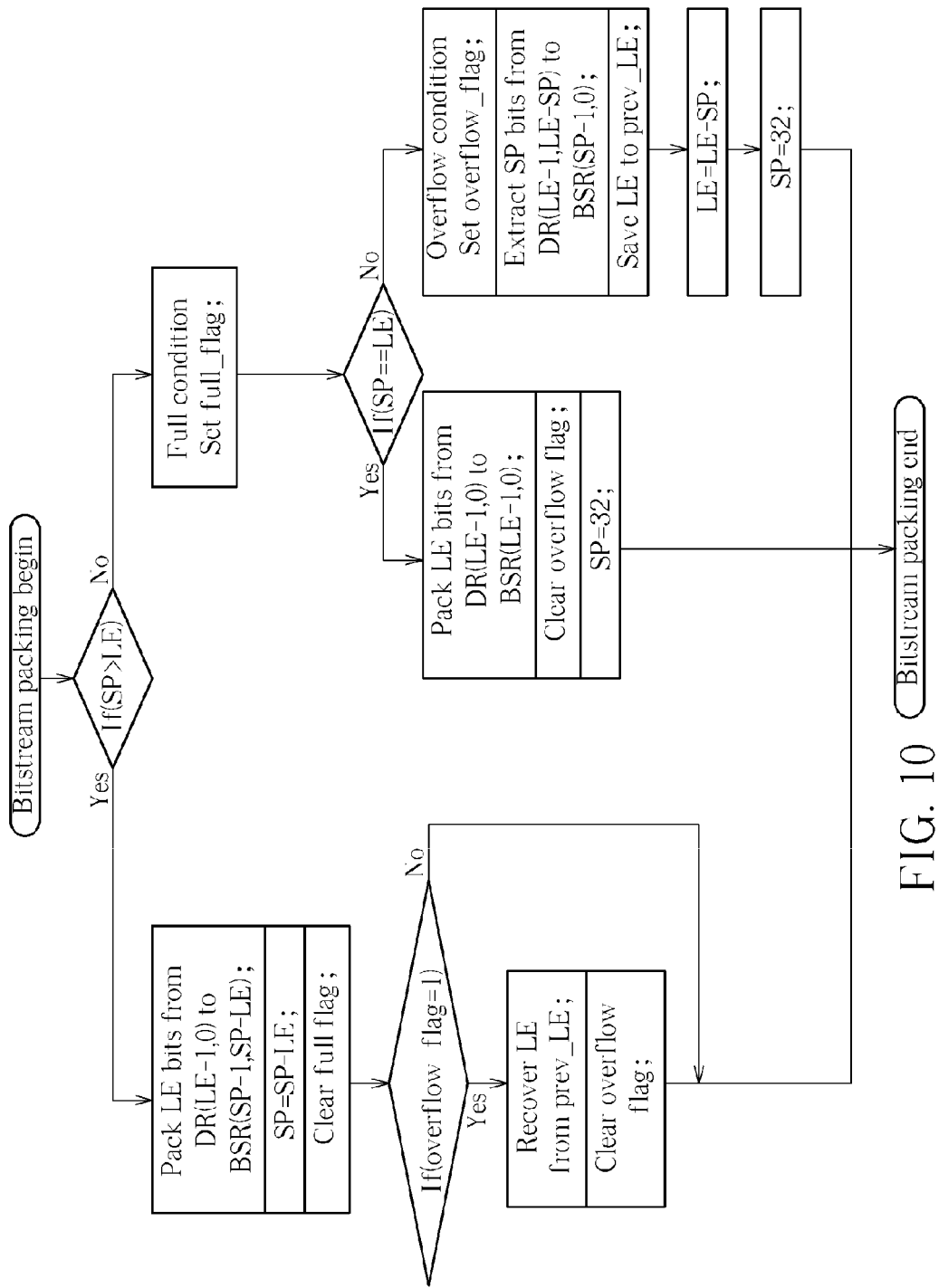
FIG. 10 is a flowchart of a method of packing bits according to the second embodiment.

Please refer to FIGS. 5-7 in conjunction with FIG. 10, which illustrate a method of packing bits to a BSR Rt from a source register (SR) Ra according to a second embodiment of the present invention. As shown in FIGS. 5-7, the BSR Rt may comprise 32 bits, from 0-31. The bits of the SR Ra may be packed and stored in the BSR Rt. A configuration register Rb may store a predetermined packing width (LE) in Rb(4,0), a predetermined starting position (SP) in Rb(9,5), a full flag in Rb(13), and an overflow flag in Rb(31). Of course, the LE, the SP, the full flag, and the overflow flag may be assigned to other parts of the configuration register Rb, or may even reside in different registers. FIG. 10 is a flowchart showing the method of packing bits to the BSR Rt from the SR Ra according to the second embodiment.

From FIG. 10, when SP>LE, LE bits, e.g. SR(LE-1,0), are packed from the SR Ra to the BSR Rt, e.g. BSR(SP-1,SP-LE). This is shown in FIG. 5, which illustrates packing bits to the BSR Rt when SP>LE. LE bits are extracted from the SR Ra, and packed into the BSR Rt starting from SP-1 bit position, e.g. BSR(SP-1,SP-LE). SP is updated to SP-LE, and the full flag is cleared. If the overflow flag was originally set, e.g. Rb(31)==1, the overflow flag is cleared, and LE is recovered from prev_LE.

Again, from FIG. 10, when SP==LE, the full flag is set, and LE bits, e.g. SR(LE-1,0) are packed from the SR Ra to the BSR Rt, e.g. BSR(LE-1,0). This is shown in FIG. 6, which illustrates packing bits to the BSR Rt when SP==LE. LE lowest bits of the SR Ra, e.g. SR(LE-1,0), are packed and stored in the BSR Rt starting from LE-1 bit position. No overflow occurs, so the overflow flag is cleared, or left unset. SP is updated to the predetermined bit, such as the most significant bit of the BSR Rt, e.g. 32, to prepare for future packing operations.

When SP<LE, the full flag is set, the overflow flag is set, and SP bits, e.g. SR(LE-1,LE-SP), are extracted from the SR Ra and packed into the BSR Rt, e.g. BSR(SP-1,0). This is shown in FIG. 7, which illustrates packing bits to the BSR Rt when SP<LE. SP lowest bits of the SR Ra, e.g. SR(LE-1,LE-SP), are packed and stored in the BSR Rt starting from SP-1 bit position. The width register containing LE is first saved to a previous_LE register, and is then updated to LE-SP, and SP is then updated to the predetermined bit, e.g. the most significant bit of the BSR Rt, e.g. 32. The previous_LE register remembers the original LE value before the update, and is used for recovering the original LE value after the next packing operation handling the second, unfinished, part of the overflow condition.

Please note that, whereas FIGS. 1-4 may illustrate different use cases for the method of extracting bits, the different use cases may be integrated individually, as a whole, or in any combination into bitstream extraction software or hardware. Likewise, FIGS. 5-7 may illustrate different use cases for the method of packing bits, and the different use cases may be integrated individually, as a whole, or in any combination into bitstream packing software or hardware.

Figure 11:
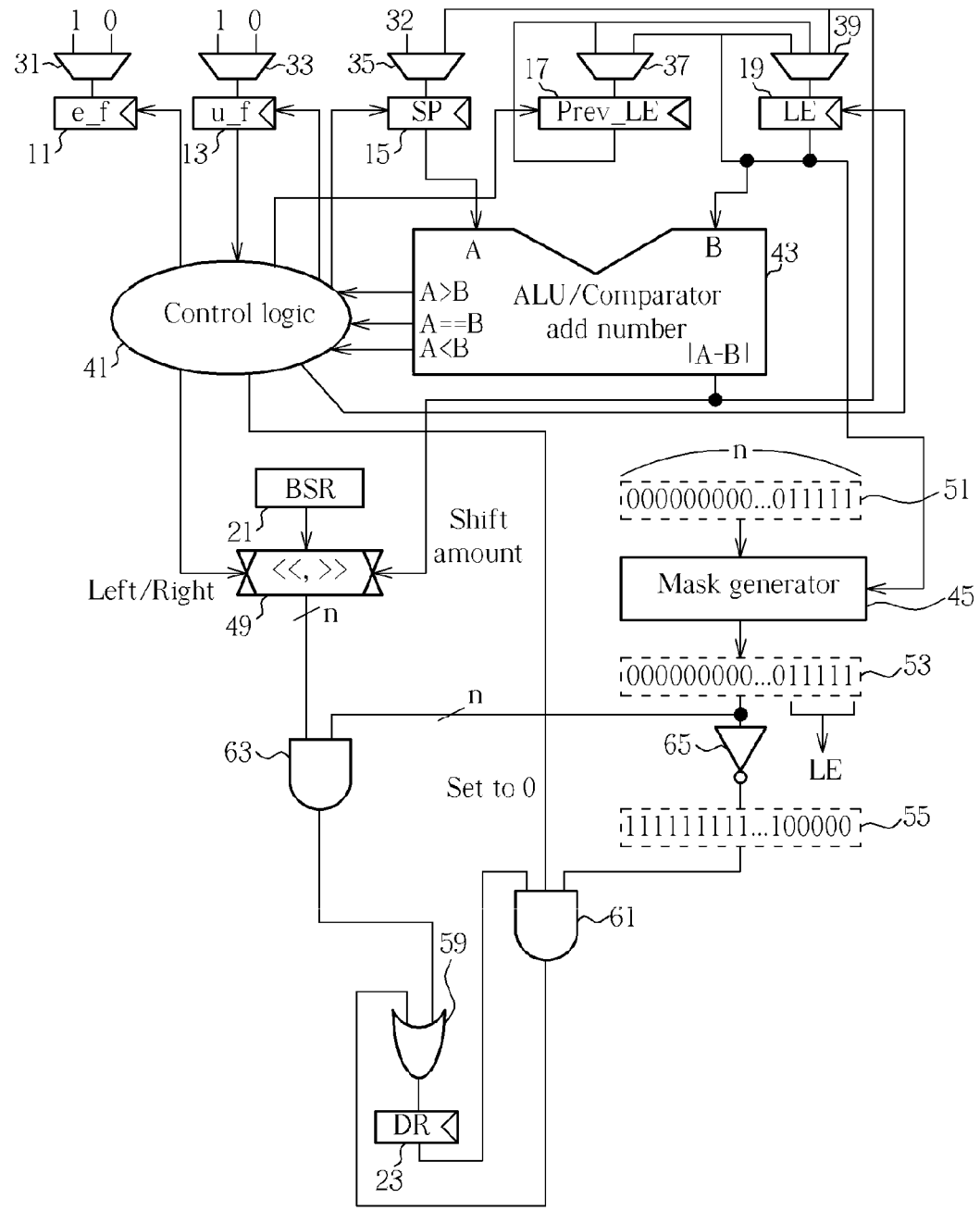
FIG. 11 is a diagram of a bitstream extraction apparatus for realizing the method of FIG. 9.
Figure 12:
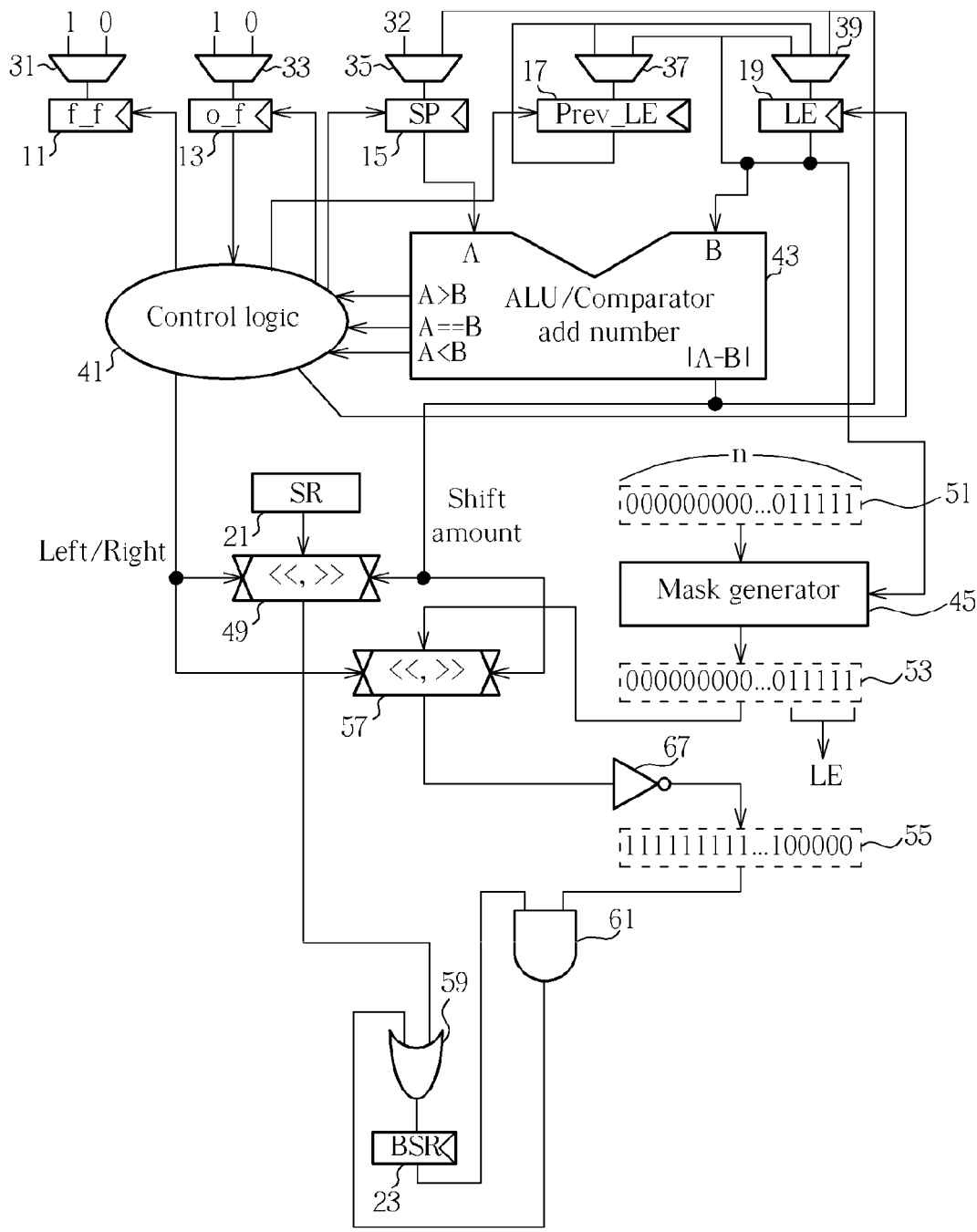
FIG. 12 is a diagram of a bitstream packing apparatus for realizing the method of FIG. 10.
Figure 13:
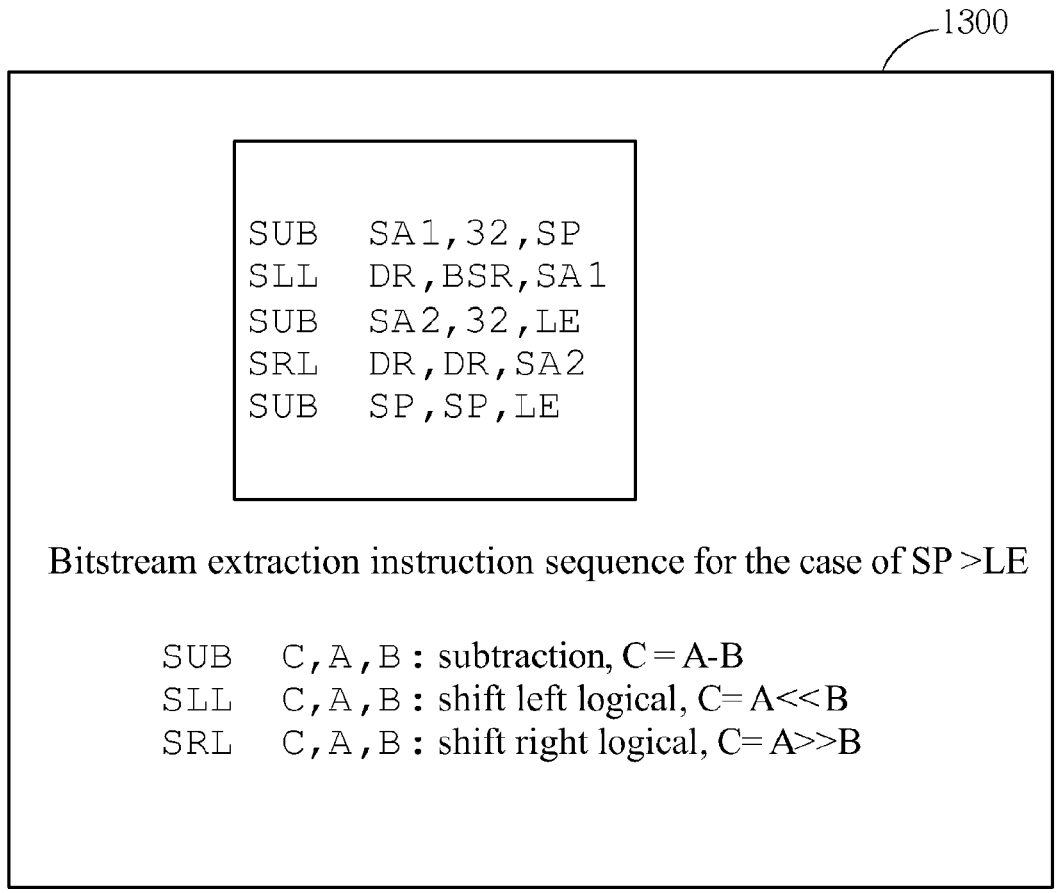
Figure 16:
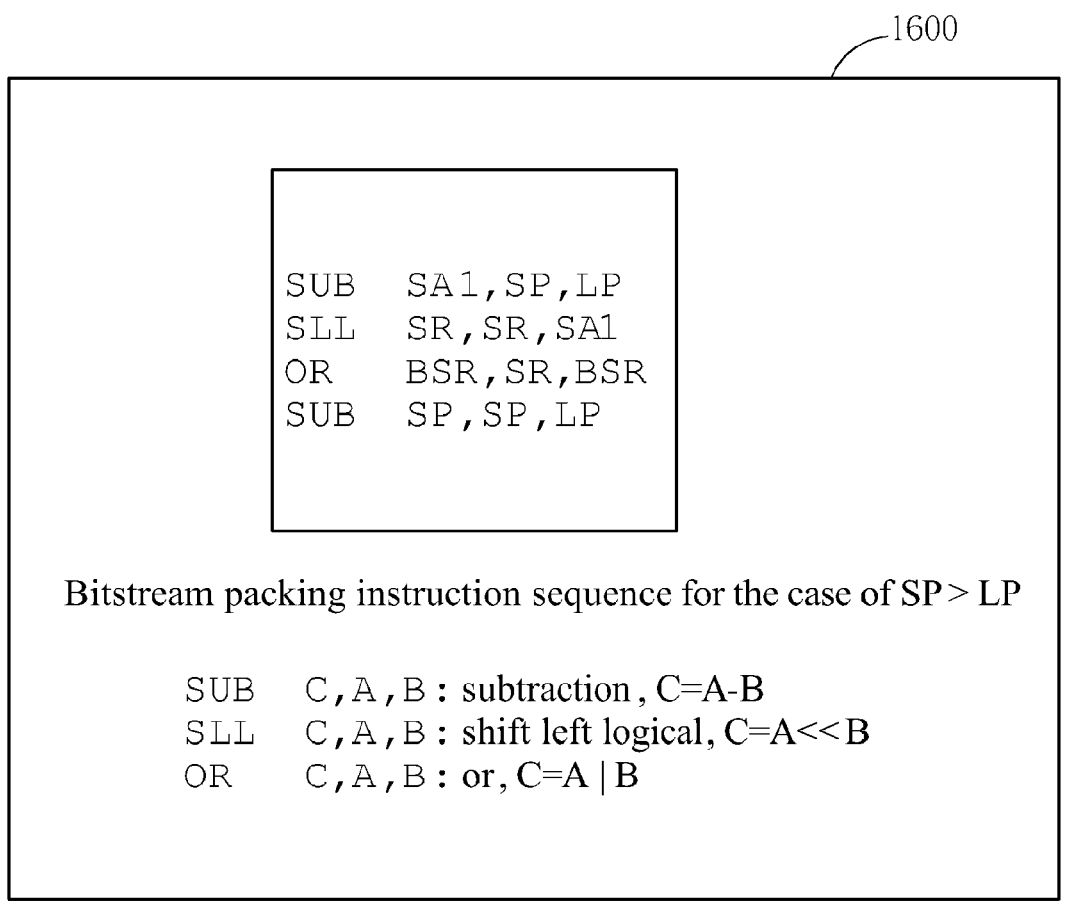
Figure 17:
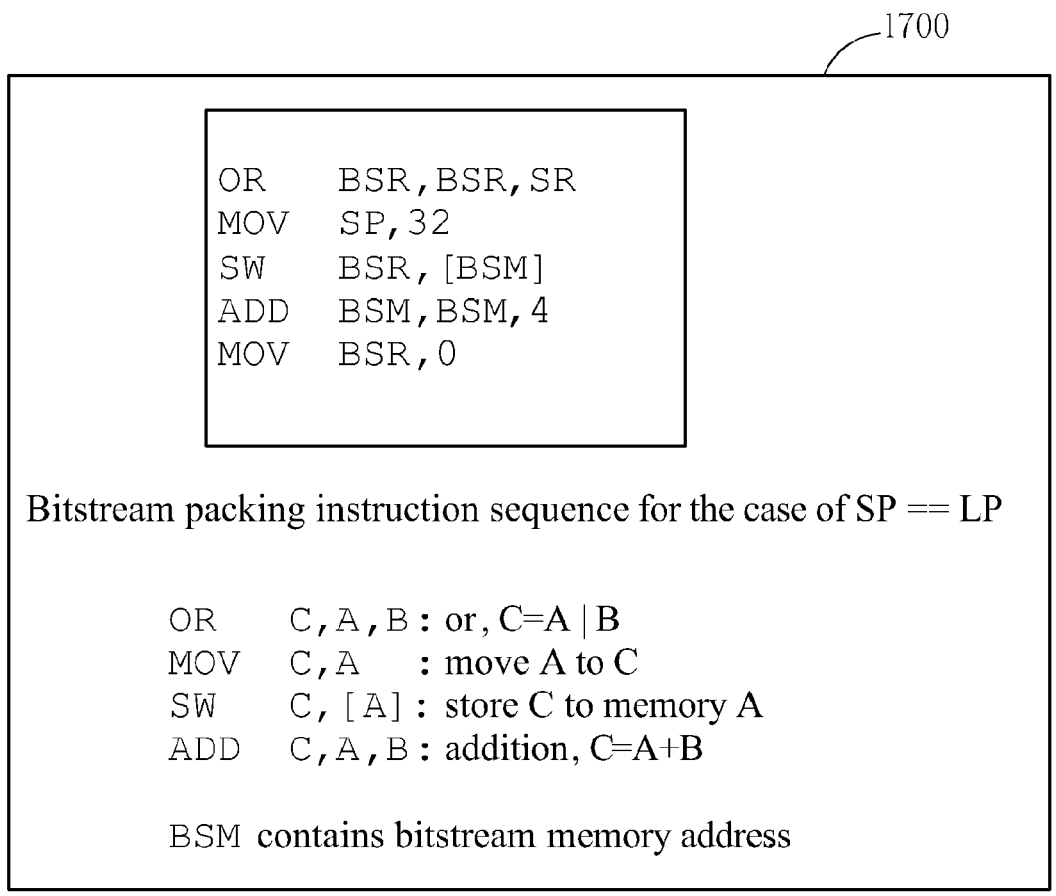

Please refer to FIGS. 11 and 12, which are diagrams of exemplary embodiments of a bitstream extraction (BSE) apparatus (FIG. 11) and a bitstream packing (BSP) apparatus (FIG. 12), which may be utilized to realize the methods of performing bitstream extraction and bitstream packing described above and illustrated in FIGS. 9 and 10, respectively. Describing first the BSE apparatus shown in FIG. 11, the BSE apparatus comprises a plurality of flip-flops (FFs) 11, 13, 15, 17, 19, 21, and 23, control logic 41 for generating selection control signals, a plurality of multiplexers 31, 33, 35, 37, 39 for selecting inputs according to the selection control signals, an arithmetic logic unit (ALU)/comparator 43, and a mask generator 45. The plurality of FFs 11-23 include an empty flag (e_f) FF 11, an underflow flag (u_f) FF 13, a starting point (SP) FF 15 for storing the starting point, a previous extraction width (Prev_LE) FF 17 for storing the previous extraction width, an extraction width (LE) FF 19 for storing the extraction width, a bitstream register (BSR) 21 storing data for extraction, and a destination register (DR) 23. The plurality of multiplexers 31-39 include an empty flag multiplexer 31 coupled to the empty flag FF 11, an underflow flag multiplexer 33 coupled to the underflow flag FF 13, a starting point multiplexer 35 coupled to the starting point register 15 and the ALU 43, a previous extraction width multiplexer 37 coupled to the previous extraction width FF 17 and the extraction width FF 19, and an extraction width multiplexer 39 coupled to the extraction width FF 19 and the ALU 43. The BSE apparatus further comprises a left/right shifter 49 for shifting the data extracted from the BSR 21 according to a difference result |A−B| generated by the ALU 43. Signal values 51, 53, and 55 are shown for illustrative purposes.

In operation, the ALU/comparator 43 takes inputs from the SP FF 15 and the LE FF 19, and based thereupon, the ALU/comparator 43 generates a comparison result, e.g. SP>LE, SP==LE, or SP<LE, to the control logic 41. The ALU 43 also generates the difference result |A−B| according to the starting point and the extraction width. The control logic 41 may output control signals to the multiplexers 31, 33 to set or clear the empty flag and the underflow flag, respectively, based on the comparison result. The control logic 41 may also output control signals to the multiplexers 35, 37, 39 to update the values of the SP FF 15, the Prev_LE FF 17, and the LE FF 19, respectively, according to the comparison result. The control logic 41 also sends a control signal to the left/right shifter 49 to control which direction (left or right) the left/right shifter 49 shifts data extracted from the BSR 21 before sending the data to the DR 23 as shifted data. The left/right shifter 49 also takes a shift amount input, i.e. the difference result |A−B|, from the ALU/comparator 43. The mask generator 45 may be utilized, for example, to generate a mask signal for setting the upper part of the DR to the predetermined value, e.g. DR(32, LE)=0. The mask generator 45, the shifter 49, and the DR 23 may be coupled to a first logic unit 63 for performing a logical AND operation on the mask signal and the shifted data.

In summary, the control logic 41 of the BSE apparatus shown in FIG. 11 may:

1) Update the extraction width;
2) Update the starting point;
3) Control left/right shift direction of the shifter 49;
4) Control the starting point multiplexer for selecting the starting point from the predetermined bit value, e.g. the most significant bit value, and the difference result;
5) Control the underflow flag multiplexer for setting or clearing the underflow flag;
6) Control the previous extraction width register for selecting to maintain the previous extraction width or to update the previous extraction width;
7) Control the extraction width multiplexer for selecting to maintain the extraction width, or to update the extraction width to the previous extraction width or the difference result; and
8) Control the empty flag multiplexer for selecting to set or clear the empty flag according to the comparison result.

The BSP apparatus shown in FIG. 12 comprises a plurality of flip-flops (FFs) 11, 13, 15, 17, 19, 21, and 23, control logic 41 for generating selection control signals, a plurality of multiplexers 31, 33, 35, 37, 39 for selecting inputs according to the selection control signals, an arithmetic logic unit (ALU)/comparator 43, a mask generator 45, a left/right shifter 49, and a second left/right shifter 57. The plurality of FFs 11-23 include a full flag (f_f) FF 11 for storing the full flag, an overflow flag (o_f) FF 13 for storing the overflow flag, a starting point (SP) FF 15 for storing the starting point, a previous packing width (Prev_LE) FF 17 for storing the previous packing width, a packing width (LE) FF 19 for storing the packing width, a source register (SR) 21 storing data for packing, and a destination bitstream register (BSR) 23. The plurality of multiplexers 31-39 include a full flag multiplexer 31 coupled to the control logic 41 and the full flag FF 11, an overflow flag multiplexer 33 coupled to the control logic 41 and the overflow flag FF 13, a starting point multiplexer 35 coupled to the starting point register 15, the ALU 43, and the control logic 41, a previous packing width multiplexer 37 coupled to the control logic 41, the previous packing width register 17, and the packing width register 19, and a packing width multiplexer 39 coupled to the ALU 43, the packing width register 19, the previous packing width register 17, and the control logic 41. Signal values 51, 53, and 55 are shown for illustrative purposes.

In operation, the ALU/comparator 43 takes inputs from the SP FF 15 and the LE FF 19, and based thereupon, the ALU/comparator 43 generates a comparison result, e.g. SP>LE, SP==LE, or SP<LE, that is sent to the control logic 41. The ALU 43 also generates a difference result |A−B| based on the starting point and the packing width. The control logic 41 may output control signals to the multiplexers 31, 33 to set or clear the full flag and the overflow flag, respectively, based on the comparison result. The control logic 41 may also output control signals to the multiplexers 35, 37, 39 to update the values of the SP FF 15, the Prev_LE FF 17, and the LE FF 19, respectively, according to the comparison result. The control logic 41 also sends a control signal to the left/right shifter 49 and the second left/right shifter 57 to control which direction (left or right) the left/right shifter 49 and the second left/right shifter 57 shift data extracted from the SR 21 and the mask signal 53 generated by the mask generator 45, respectively, before sending the data to the BSR 23 and the mask signal 53 to a logical AND unit 61. The left/right shifter 49 and the second left/right shifter 57 also take a shift amount input |A−B| from the ALU/comparator 43 for determining how many bits to shift the data of the SR 21 and the mask signal 53 of the mask generator 45, respectively. The mask generator 45 may be utilized, for example, to keep the upper part of the BSR to its old value before and after the packing operation.

In summary, the control logic 41 of the BSP apparatus shown in FIG. 12 may:
1) Update the packing width;
2) Update the starting point;
3) Control left/right shift direction of the shifter 49 and the second shifter 57;
4) Control the starting point multiplexer for selecting the starting point from the predetermined bit value, e.g. the most significant bit value, and the difference result;
5) Control the overflow flag multiplexer for setting or clearing the overflow flag;
6) Control the previous packing width register for selecting to maintain the previous packing width or to update the previous packing width;
7) Control the packing width multiplexer for selecting to maintain the packing width, or to update the packing width to the previous packing width or the difference result; and
8) Control the full flag multiplexer for selecting to set or clear the full flag according to the comparison result.

Thus, in the embodiments of the methods of extracting and packing bits and the related BSE and BSP apparatuses described above, the empty flag, the full flag, the underflow flag, and the overflow flag are utilized when handling boundary conditions, such as underflow and overflow, during successive extraction and packing. During extraction under the underflow condition, the starting position in the bitstream source register is automatically adjusted, and the extraction width in the configuration register is also automatically adjusted for the two successive underflow extraction operations. And, the upper part of the destination register is not changed in the second underflow extraction operation. In this way, the underflow condition may be handled more efficiently. During packing under the overflow condition, the starting position in the bitstream destination register is automatically adjusted, and the packing width in the configuration register is also automatically adjusted for the two successive overflow packing operations. In this way, the overflow condition may be handled more efficiently.

Those skilled in the art will readily observe that numerous modifications and alterations of the device and method may be made while retaining the teachings of the invention.

What is claimed is:

1. A method of extracting bits from a bitstream register, the method comprising:
   extracting a predetermined number of bits from the bitstream register starting from a most significant bit of the bitstream register when an underflow flag is set, the predetermined number equaling a predetermined extraction width minus a previous starting position;
   storing the bits in a lowest part of a destination register and keeping an upper part of the destination register not storing the bits unchanged when the underflow flag is set; and
   unsetting an empty flag and the underflow flag.

* * * * *